United States Patent
Staudenmaier

(10) Patent No.: US 9,678,118 B2
(45) Date of Patent: Jun. 13, 2017

(54) METHOD FOR CHECKING THE ABSENCE OF VOLTAGE ON A POWER ELECTRONIC COMPONENT OF A MOTOR VEHICLE

(71) Applicant: AUDI AG, Ingolstadt (DE)

(72) Inventor: Sascha Staudenmaier, Gaimersheim (DE)

(73) Assignee: AUDI AG, Ingolstadt (DE)

( * ) Notice: Subject to any disclaimer, the term of this patent is extended or adjusted under 35 U.S.C. 154(b) by 49 days.

(21) Appl. No.: 14/897,845

(22) PCT Filed: May 30, 2014

(86) PCT No.: PCT/EP2014/001465
§ 371 (c)(1),
(2) Date: Dec. 11, 2015

(87) PCT Pub. No.: WO2014/198383
PCT Pub. Date: Dec. 18, 2014

(65) Prior Publication Data
US 2016/0124028 A1    May 5, 2016

(30) Foreign Application Priority Data

Jun. 12, 2013 (DE) .................. 10 2013 009 802

(51) Int. Cl.
*G01R 31/08* (2006.01)
*G01R 27/08* (2006.01)
(Continued)

(52) U.S. Cl.
CPC ............ *G01R 19/155* (2013.01); *B60L 1/003* (2013.01); *B60L 1/02* (2013.01); *B60L 3/0069* (2013.01);
(Continued)

(58) Field of Classification Search
CPC .... G01R 31/00; G01R 31/002; G01R 31/006; G01R 31/02; G01R 31/08; G01R 31/28;
(Continued)

(56) References Cited

U.S. PATENT DOCUMENTS 3,956,697 A * 5/1976 Nery ................. G01R 19/16595
324/133
7,342,755 B1 * 3/2008 Horvat .................... H02J 7/345
361/18
(Continued)

FOREIGN PATENT DOCUMENTS

DE   21 2007 000 057    5/2009
DE   10 2009 036 672    5/2010
(Continued)

OTHER PUBLICATIONS

International Search Report issued by the European Patent Office in International Application PCT/EP2014/001465.

*Primary Examiner* — Hoai-An D Nguyen
(74) *Attorney, Agent, or Firm* — Henry M. Feiereisen LLC

(57) ABSTRACT

A method is disclosed for checking the absence of voltage on a power electronic component connected to a high-voltage battery and to an electrical machine in a high-voltage network of a motor vehicle, which component has a higher voltage than a low-voltage network of the motor vehicle. The power electronic component includes an intermediate circuit capacitor, a passive discharge resistor, a plug-in terminal for at least one high-voltage load and a fuse which is connected upstream of the plug-in terminal. Following disconnection of the high-voltage battery from the high-voltage network and when the connector of the cable plugged into the plug-in terminal is withdrawn from the plug-in terminal or a target terminal, a feed voltage is applied via the high-voltage contacts of the plug connection (Continued)

and the voltage curve and/or, after a defined charging time interval of the intermediate circuit capacitor, the resistance is measured by means of a measuring instrument, wherein an absence of voltage is determined in the event of a voltage curve lying in an intended range or a resistance lying in an intended range.

17 Claims, 6 Drawing Sheets

(51) Int. Cl.
| | | |
|---|---|---|
| *G01R 31/02* | (2006.01) | |
| *G01R 19/155* | (2006.01) | |
| *G01R 31/28* | (2006.01) | |
| *B60L 3/00* | (2006.01) | |
| *B60L 3/04* | (2006.01) | |
| *G01R 31/00* | (2006.01) | |
| *B60L 1/00* | (2006.01) | |
| *B60L 1/02* | (2006.01) | |

(52) U.S. Cl.
CPC ............. *B60L 3/04* (2013.01); *G01R 31/006* (2013.01); *G01R 31/2812* (2013.01); *G01R 31/2813* (2013.01); *G01R 27/08* (2013.01); *G01R 31/02* (2013.01)

(58) Field of Classification Search
CPC .............. G01R 31/2801; G01R 31/281; G01R 31/2812; G01R 31/2813; G01R 19/00; G01R 19/0084; G01R 19/0082; G01R 27/00; G01R 27/02; G01R 27/08; B60L 1/003; B60L 1/02; B60L 3/0069; B60L 3/04
USPC ....... 324/500, 512, 522, 525, 537, 555, 600, 324/649, 691, 713, 76.11; 702/1, 57, 64
See application file for complete search history.

(56) References Cited

U.S. PATENT DOCUMENTS

| | | | |
|---|---|---|---|
| 9,057,750 B2* | 6/2015 | Thommes | B60L 3/0069 |
| 2009/0146641 A1* | 6/2009 | Sanderford, Jr. | G01R 22/066 |
| | | | 324/110 |
| 2010/0250194 A1 | 9/2010 | Newhouse et al. | |
| 2013/0006466 A1 | 1/2013 | Sichert | |
| 2013/0264994 A1 | 10/2013 | Schaefer | |
| 2013/0313903 A1* | 11/2013 | Kayama | H02J 1/00 |
| | | | 307/26 |

FOREIGN PATENT DOCUMENTS

| | | |
|---|---|---|
| DE | 10 2010 012 154 | 9/2011 |
| DE | 10 2010 045 501 | 3/2012 |
| DE | 10 2010 048 985 | 4/2012 |
| DE | 10 2010 056 235 | 6/2012 |
| DE | 10 2011 104 224 | 12/2012 |
| DE | 10 2011 104 819 | 12/2012 |
| DE | 10 2012 000 598 | 7/2013 |
| EP | 2 556 980 | 2/2013 |

* cited by examiner

METHOD FOR CHECKING THE ABSENCE OF VOLTAGE ON A POWER ELECTRONIC COMPONENT OF A MOTOR VEHICLE

CROSS-REFERENCES TO RELATED APPLICATIONS

This application is the U.S. National Stage of International Application No. PCT/EP2014/001465, filed May 30, 2014, which designated the United States and has been published as International Publication No. WO 2014/198383 and which claims the priority of German Patent Application, Serial No. 10 2013 009 802.5, filed Jun. 12, 2013, pursuant to 35 U.S.C. 119(a)-(d).

BACKGROUND OF THE INVENTION

The invention relates to a method for checking the absence of voltage on a power electronics component connected to a high-voltage battery and an electric machine in a high-voltage network of a motor vehicle, which high-voltage network has a higher voltage than a low-voltage network of the motor vehicle, wherein the power electronics component has an intermediate capacitor, a passive discharge resistor, a plug-in terminal for at least one high-voltage load and a fuse connected upstream of the connector connection.

In the state of the art motor vehicles are known that have a low-voltage network, whose voltage is for example around 12V, and a high-voltage network, whose voltage is higher than that of the low-voltage network. The best-known examples for this are hybrid motor vehicles and electric motor vehicles. These have an electric machine, which can support propulsion of the motor vehicle and can also generate electrical energy from the movement of the motor vehicle. Further a high-voltage battery is usually assigned to the high-voltage network. High-voltage networks in the narrower sense include all networks of a motor vehicle whose voltage is greater than 60V DC voltage.

When such a high-voltage network is present, it is common to provide further high-voltage loads in the motor vehicle. Examples for such further loads are a charging device for the high-voltage battery (often also referred to as "On Board Charger" OBC), devices that are assigned to an air-conditioning system, for example a compressor, or high-voltage heating devices.

Since the electric machine generates an AC voltage and voltages may also have to be adjusted for other reasons, a power electronics component is provided in high-voltage networks of the described type, to which the electric machine and the high-voltage battery are usually securely fastened. Such a power electronics component also has for example a plug-in terminal via which further high-voltage loads can be connected by means of a connector and an appropriate cable connection. The power electronics component can have an inverter for converting AC voltage on the side of the electric machine into DC voltage on the side of the remaining high-voltage network and vice versa, and a rectifier. The power electronics component usually also has an intermediate circuit capacitor to which components for active discharge, and also a passive discharge resistor can be connected in parallel. A fuse, which is usually provided between the parallel connection of intermediate circuit capacitor and the discharge resistor and the plug-in terminal, separates the high-voltage load from the high-voltage source in case of a short circuit.

An important topic in motor vehicles with such a high-voltage network is the protection of persons from the high-voltage. In particular when maintenance work is performed on the motor vehicle, for example in a repair shop, it has to be possible to protect persons against the high-voltage in a simple yet reliable manner. While plug-in connections, for example that of the plug-in terminal, already have electric shock protection, it still has to be ensured that after deactivation of the high-voltage network no high-voltage remains in the system. This applies in particular to the power electronics component since there voltages may still remain for example on the intermediate circuit capacitor due to errors and/or the failure of discharge mechanisms. Thus procedures are known to ensure the absence of voltage also in the power electronics component.

Thus it is known in the state of the art to first separate the high-voltage battery from the high-voltage network. This is usually accomplished via contactors, which are provided in the high-voltage battery. In addition, a so-called "service disconnect" is usually provided, which removes the operating voltage for the contactors when being pulled and also interrupts the high-voltage pilot line. In order to secure the high-voltage network against re-activation this 12V service disconnect is usually secured with a lock.

In order to check the absence of voltage on the power electronics component it is known to open the power electronics component, for example by opening a lid of the power electronics component. Then it is checked with a measuring device at predetermined specific measuring sites in the power electronics component whether a high-voltage is still present. This has several drawbacks. On one hand opening the power electronics component and performing multiple voltage measurements in the power electronics component increases the required time until activation of the high-voltage network. The opening of the housing of the power electronics component also not only generates a high risk of contamination but may also compromise the tightness of the housing of the power electronics component. The procedure is also cost-intensive because a so-called touch guard insert is required in the power electronics component. Also for the activation itself the costs are high since the touch guard insert and the screws have to be replaced because the power electronics component has been opened.

There have also been efforts to determine the absence of voltage in the high-voltage network, specifically also in the power electronics component, by means of self-diagnosis in the motor vehicle, however, no accepted variant that satisfies the general safety requirements is yet known so that a manual disconnect and thus a manual testing of the voltage absence is still required and useful.

DE 10 2010 056 235 A1 relates to a method for checking a testing device for determining a voltage status of a high-voltage network of a motor vehicle. A test voltage for generating a predefined voltage state is introduced in a targeted manner, in particular by an external voltage source, and is measured with the testing device. The voltage state measured by the testing device is compared with the predetermined voltage state, wherein a deviation indicates the presence of an error.

DE 120 2010 012 154 A1 relates to a method for checking a state of an electric circuit of a motor vehicle. After querying a state it is checked whether the state is actually present. Concretely, the voltage of the electric circuit can be measured for the checking.

The subsequently published DE 10 2012 000 598 A1 discloses a motor vehicle high-voltage system with a fuel cell unit. A safety unit limits, at least in an inactive state of the drive device, the voltage in the high-voltage network and measures the voltage to enable monitoring the voltage.

SUMMARY OF THE INVENTION

The invention is based on the object to set forth an improved possibility to determine the voltage absence of the power electronics component, which is in particular simplified and avoids opening of the power electronics component.

In order to solve this object a method of the aforementioned type provides that after separation of the high-voltage battery from the high-voltage network, and when the connector is pulled out of the plug-in terminal or a target connection of the cable inserted in the outlet, a supply voltage is applied via the high-voltage contacts of the plug-in terminal and the voltage course and/or, after a defined charging time period of the intermediate circuit capacitor, the resistance is measured with a measuring device, wherein an absence of voltage is determined when the voltage course is within a first setpoint range or when the resistance is within a second setpoint range.

The invention is based on the recognition that simply measuring the voltage applied to the plug-in terminal via the high-voltage contacts does not lead to the desired result. Even though in most cases the fuse is not defective and thus the absence of voltage can be determined correctly, every time the fuse is not functioning properly (or a cable is damaged or the like) an absence of high-voltage at the plug-in terminal is measured, which does not necessarily indicate an absence of voltage in the power electronics component, in particular at the intermediate circuit capacitor. This is because the fuse is provided between the parallel connection of intermediate circuit capacitor and discharge resistor and the plug-in terminal, so that in case of an interrupted line at this location, in particular due to the defective fuse, measurements in the power electronics component are no longer accurate. Therefore the present invention proposes a measuring variant, which additionally plausibilizes the fuse. For this purpose it is provided that after the intermediate circuit capacitor is fully actively or also passively discharged, which as will be explained below is preferably tested via an additional testing, a supply voltage (protective small voltage) is applied via the plug-in terminal, which is preferably smaller than 30V. A conceivable value for measuring the voltage course is 24V, and for measuring the resistance, which according to the invention is preferred, is 4V, wherein in this case the measuring voltage generated anyway by the resistance-measuring device can be used as supply voltage. When the overall system, in particular also the fuse, is intact the intermediate circuit capacitor is first charged to the supply voltage, or in the case of using a voltage divider for the measuring, is charged to a corresponding partial voltage, whereupon the entire current flow or voltage drop is accomplished via the discharge resistor (and optionally via further resistors provided in the measuring arrangement, which will be explained in more detail below).

When observing the voltage course in a first, less preferred variant of the invention, in which measuring has to be performed at at least two time points, multiple options exist depending on the state of the fuse and the absence of voltage. When the fuse is defective the voltage course will show a very fast, in particular abrupt, increase of the voltage to the value of the supply voltage because current can no longer flow in the power electronics component. When the fuse is functioning properly and the intermediate circuit capacitor is sufficiently discharged, for example to 0.5V, the intermediate circuit capacitor is only recharged slowly, which results in a slowly increasing voltage course, in particular when a voltage of $U_L$ is inputted according to the formula $$U_M(t)=U_L*(1-e^{-(t/\tau)})$$

wherein $U_M$ is the measured voltage and $\tau$ is the time constant. When the fuse is functional, but a greater residual voltage is present in the power electronics component, the voltage, which is present anyway in the power electronics component, is measured.

Monitoring the voltage course also allows clearly distinguishing between cases in which the absence of voltage is given and the fuse is functioning properly and all errors, for example a defective fuse and no absence of voltage. For this purpose the measured voltage course is compared with a first setpoint range for the voltage course, which can easily be derived for example from calibration measurements, simulations and/or calculations for the specific configuration. Only when the measured voltage course is within this first setpoint range it can be safely be concluded that an absence of voltage is given in the power electronics component. Hereby the measurement of the voltage course is also conceivable as a simple two-point measurement, in which measuring is performed at defined time points after applying the supply voltage and a comparison is performed with corresponding first setpoint ranges. It is also possible to use a delay element for the analysis, which after a defined time period, for example 0.5 s, tests whether the measured voltage is smaller than 20V. Of course observing the entire voltage course also has advantages because it allows determining the presence of certain errors, for example a defective fuse, by way of diagnosis as described above.

The preferred alternative according to the invention, however, is to measure the resistance. When the resistance is observed during the charging process of the intermediate circuit capacitor during application of the supply voltage, the resistance will slowly increase and reach a relatively fixed, i.e., only slowly increasing, value already after a short period of time of at least 5 seconds, for example 7-21 s, which value is indicative for the intact state and the absence of voltage in the power electronics component, i.e., the resistance has definitely exceeded a threshold value defined by the second setpoint range. This is because when the resistance is infinitely high this indicates a defective fuse or a broken cable either in the power electronics component itself or at another site in the measuring chain. In this case the absence of voltage in the power electronics component cannot be determined with certainty. When no pre-measuring, as explained below, is performed which should preclude a resistance measuring when determining an excessive voltage, and a high voltage is still present in the power electronics component and the fuse is functional, the supply voltage is evidently practically "overwritten" and no meaningful measuring result (expected "measuring error") is obtained. However, such a measuring of the voltage via the high-voltage contacts of the plug-in terminal is preferred because it increases safety. In case of a short circuit, a very low resistance or other resistance introduced into the measuring chain is measured, for example at least one electric-shock-hazard protective resistor. Thus a clearly defined second setpoint range exists for the resistance in which an absence of voltage in the power electronics component is clearly given. Also in this case the setpoint range can of course be determined via calibration measurements, simulations and/or calculations.

Measuring the resistance is preferred mostly because the temporal component is less significant. Only a defined waiting period has to be observed until the resistance can be measured, however, it is not relevant when it is measured. In addition measuring the resistance has the advantage that the supply voltage is delivered as measuring voltage by the corresponding measuring device anyway in order to generate the appropriate conditions for the current measurement and the resistance result.

After the measuring of the voltage course or the resistance, the supply voltage is removed again. For additional testing it can be provided to record and analyze the voltage course also during discharging, which however is not strictly required and can be omitted especially in case of a resistance measurement.

Overall, the method according to the invention thus proposes a solution, which allows determining from outside the power electronics component, whether voltage is absent in the power electronics component, without having to open the power electronics component, wherein in addition the status of a fuse can also be tested, i.e., it can be excluded that measurement of an absence of voltage is based on a defective fuse, and would thus be deceptive. This obviates opening of the housing of the power electronics component, for example a lid. The risk of contamination and the risk of compromising tightness of the power electronics component is strongly reduced. This saves costs because a touch-guard insert in the power electronics component is no longer required and can thus be omitted. Sealings and screw and touch-guard inserts no longer have to be replaced. In addition the method also saves work time, which would otherwise be required for opening the power electronics component so that for example more than 20 minutes of work time can be saved. When a high-voltage interlock (HV-interlock) also safety pilot line) is provided in the lid of the power electronics component, no significant wear occurs. When a defective fuse was determined in the power electronics component, the power electronics component would have to be opened anyway whereupon the determination of an absence of voltage in the power electronics can then be performed.

The method according to the invention thus provides the basis for a reliable and simple determination of the absence of voltage in the power electronics component, which can also be performed by less qualified personnel. So long as the measurement values are within the respective setpoint range the absence of voltage is given and other work can be performed. When a measurement is outside the corresponding setpoint range, an expert for high-voltage systems or an electrical worker can be consulted as a fall back or a first diagnosis can be provided by detailed analysis of the measuring values.

A useful refinement of the present invention provides that prior to the measurement of the voltage course and measurement of the resistance, a voltage measurement is performed via the high-voltage contacts of the plug-in terminal. At least for the case that the fuse is functioning properly it can be determined by a simple voltage measurement whether a high-voltage is still present in the power electronics component, so that in case of doubt the measurement of the voltage course and/or resistance can be omitted because it is known anyway that an error is present.

Preferably when it is determined after the measurement of the voltage course and/or the resistance that voltage is absent, a voltage measurement can be performed at at least one reconnected high-voltage load via the high-voltage contacts. Since it is known that the fuse is not defective (and no other problem exists) the absence of voltage can subsequently be determined again for all high-voltage loads. This can further increase safety, but is less relevant when the high-voltage loads or other components are configured with touch-guarded plugs. Further errors can optionally be covered when additionally measuring a voltage between a respective high-voltage contact of the plug-in terminal and a shielding contact to a reference potential, in particular ground. This allows for example detecting short circuits and the like.

In this context it is noted that high-voltage loads can for example include a charger (OBC), a compressor of an air-conditioning system, a high-voltage heating device and/or the like. For example it is conceivable that high-voltage loads are coupled to the power electronics component via the charging device, wherein, however, other infrastructures are also possible.

Overall when performing voltage measurements it is useful to first test for each voltage measurement whether the measurement device is functional by measuring the reference voltage, in particular the voltage of a low-voltage battery of the low-voltage network. For example it can be tested whether the measuring device correctly indicates 12V for the low-voltage battery before performing further measurements. In this way the functionality of the measuring device and the measuring lines can be tested and verified as far as possible.

In a particularly advantageous embodiment of the present invention it can be provided that after pulling the connector to the at least one high-voltage load out of the plug-in terminal or target connection, a measuring adapter is connected to the plug-in terminal or to the connector removed from the target connection of the cable inserted in the plug-in terminal, wherein the measuring device and the supply voltage are connected to the measuring contacts of the measuring adapter. In this way the measuring device does not have to be operated directly at the potentially inappropriate plug-in terminal, where the touch-guarded plug-in terminal may complicate a correct connection to the high-voltage contacts. In addition the improper contacting may cause damage to and scratches on the plug-in contacts, which in the worst case may lead to failures in the subsequent operation. Such a measuring adapter is therefore very advantageous because it has an appropriate plug, which can be inserted into the plug-in terminal, or has an appropriate plug-in terminal, which can be inserted into the connector of a cable inserted into the plug-in terminal. Particularly preferably both is provided so that the high-voltage loads can also be reconnected to the power electronics component via the measuring adapter, for example when the entire high-voltage network is to be tested via voltage measurements including the high-voltage loads. In this case such a measuring adapter has appropriate measuring connections, which are specifically suited for connection of measuring devices. Such a measuring adapter can also provide the connection to a reference potential, i.e., a shielding contact, when measurements are to be conducted in this regard, or can be used to bridge the high-voltage pilot line (high-voltage interlock) and the like. In any case, this offers a more reliable way for connecting the measuring device, which at least in the case of resistance measurements, also provides the supply voltage.

In a particularly useful embodiment of the present invention, the measuring adapter can have a touch-protective resistor for each high-voltage measuring connection, which touch-protective resistor is taken into account in the determination of the first and/or second setpoint range, in particular for the resistance. This not only generates a further heretofore not demanded safety, but also the touch protective resistors are also particularly advantageous when the resistance measurement is performed. Because in this case the sum of the touch protective resistors forms a type of "offset" for the resistor which in particular allows operating the measuring device within a single fixed measuring range so that effects caused by the switching between measuring ranges no longer have a strong influence on the measurement. For example it can be measured in the kilo-ohm range when touch protective resistors of 100 kΩ are used. The touch protective resistors also allow differentiating, whether a short circuit is present upstream or downstream of the touch protective resistor. In addition, the touch protective resistors provide a type of basic value to which in the normal case, i.e., absence of voltage and otherwise intact components, the passive discharge resistor is added, which is within a certain range, since further resistors also have an influence in addition to the passive discharge resistor in the power electronics component, for example resistors in the high-voltage battery and the like.

It is noted that due to the method according to the invention, i.e., the measuring by the measuring adapter, of course also the measuring adapter is tested regarding its functionality and accuracy. Because short circuits in the measuring adapter or disrupted lines in the measuring adapter also lead to the already mentioned effects, which can be detected. As a result the otherwise required testing of the measuring adapters can be omitted, i.e., also the stress on plug-in contacts (for example damage/scratches).

In a preferred embodiment the analysis of the voltage course and/or the resistance can be performed by an analysis unit arranged downstream of the measuring device. Thus, it is also conceivable to perform a fully automatic analysis of the measuring values, which may either result in the binary decision between "absence of voltage given" and "absence of voltage not given or error" or which may also be more detailed, for example with regard to specific errors. Thus reference voltage courses or reference resistances or reference ranges can be stored that are characteristic for certain errors, for example a defective fuse or remaining high-voltages, so that a computerized analysis can also provide detailed information as a result of the measurement.

Advantageously the measuring device and/or the analysis device are part of a repair-shop tester. Such testing devices are known in the state of the art and in most cases also offer functions of a multi-measurement device so that a voltage measurement as well as a resistance measurement are possible with such repair-shop testers. It is for example also conceivable to provide a dedicated, independent measuring device, which can then be coupled to the repair-shop tester or generally to the analysis device via an appropriate connection, for example a USB connection, where the analysis can then be performed automatically.

As described above the first and/or second setpoint range can be determined from results of a calibration measurement and/or a simulation and/or from theoretical calculations. The setpoint ranges of course depend on the concrete configuration of the high-voltage network and the power electronics component, wherein additional devices can be used, for example measuring adapters or the measuring devices themselves.

It is useful when setpoint ranges are used as the first and/or second setpoint range that are valid for at least two motor vehicles with different specifications. In this case it is in particular possible to cover all motor vehicles of a fleet of a manufacturer, when a sufficient differentiation between errors remains possible. In this context it is also useful when a standardized measuring adapter and/or a standardized measuring device are used.

As mentioned above, when performing a resistance measurement the measuring voltage, which is used anyway by the measuring device, can be used as supply voltage. For the measurement of the voltage course it is useful when a power supply is used for the supply voltage. For example a 24V power supply can be used. For protecting the power supply it can be provided to use a protective diode. It is for example conceivable to use a protective/flywheel diode with a break-down voltage of 1000V. It can also be useful, in particular when no touch protective resistors are used, to use a charge resistor in the overall circuit, for example with a value of 10 kΩ. The power supply, the protective diode and optionally the defined charging resistor can be part of an additional adapter, which in turn can be attached to a measuring adapter. This additional adapter can already have appropriate measuring connections, which enable the connection of the measuring device for measuring the voltage course.

A refinement of the method according to the invention can provide that in case of a resistance measurement, additionally a measurement of the resistance between the shielding contact and measuring adapter and the reference potential, in particular ground, of the motor vehicle can be performed. This allows excluding further errors, in particular with regard to the fact that voltage measurements can be subsequently performed between the high-voltage contacts and the shielding contact.

For checking the absence of voltage in the power electronics component according to the method according to the invention, a testing system can be provided, which has a measuring adapter, which can be directly or indirectly connected to the plug-in terminal of the power electronics component, a measuring device and an analysis device. The analysis device is configured to compare the measured voltage courses and/or resistance with the corresponding setpoint ranges and to analyze them regarding at least whether an absence of voltage is reliably given. However, the analysis device can also perform more detailed analysis tasks. The measuring device and/or at least the analysis device can hereby be part of a repair-shop tester.

The measuring adapter, as described above, can be connected to the plug-in terminal of the power electronics component, i.e., it has an appropriate standardized plug. It is also preferred however when the measuring adapter can be connected to a cable inserted in the plug-in terminal, i.e., it also has a corresponding appropriate, preferably also standardized, plug-in terminal. In any case the plug-in systems used in the present invention should be configured with electric-hazard-protection, wherein a division into different standards or classes based on the current carrying capacity is possible. When the measuring adapter is connectable to a cable and also directly to the plug-in terminal of the power electronics component, this has the further advantage that alternately a connection via the cable or directly to the power electronics component can be accomplished so that wear of the sensitive plug-in terminal is prevented.

Further advantages and details of the present invention will become apparent from the exemplary embodiments explained in the following and from the drawing. Hereby it is shown in:

DETAILED DESCRIPTION OF PREFERRED EMBODIMENTS

Figure 1:
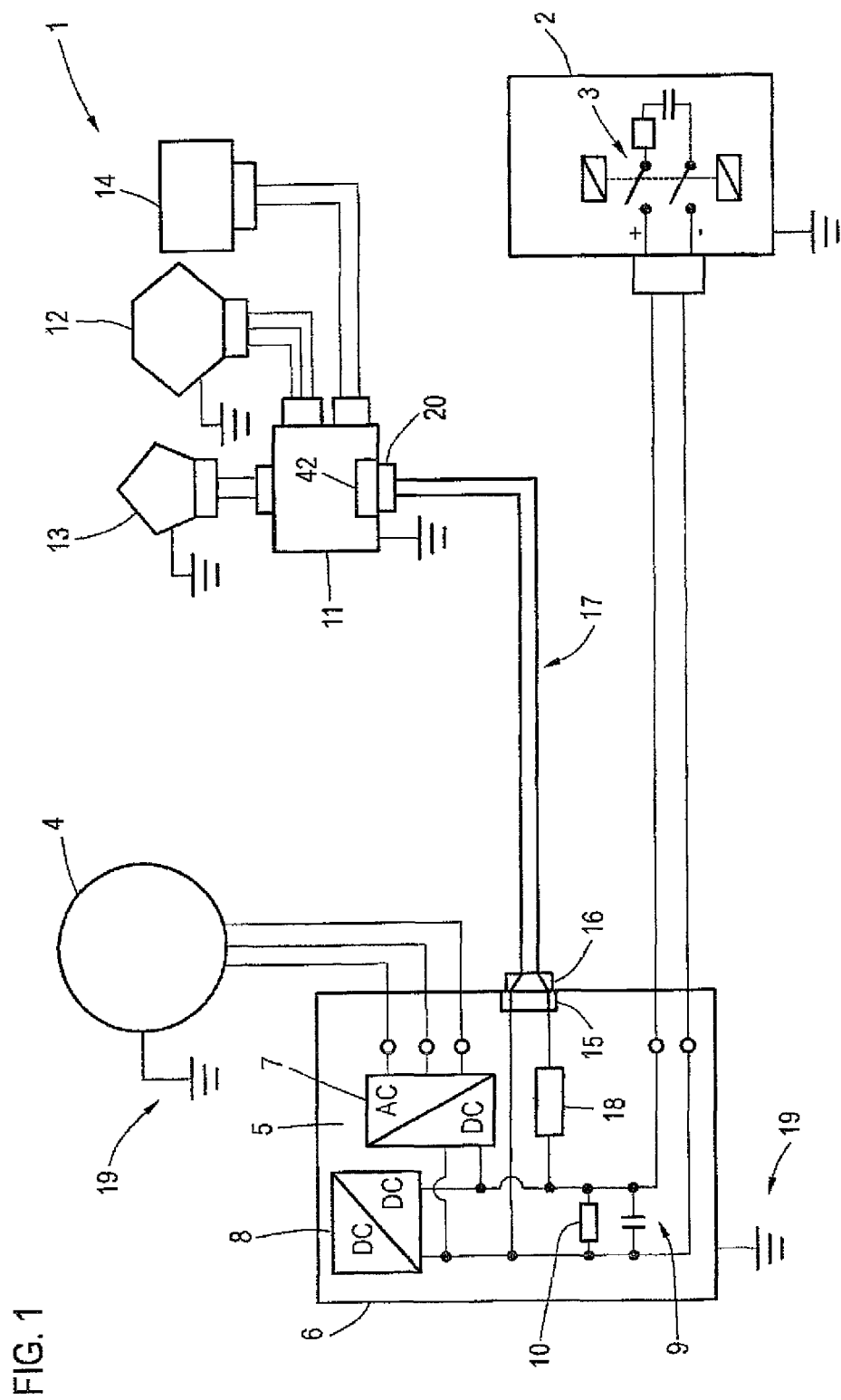
FIG. 1 a high-voltage network of a motor vehicle in the operating state.

FIG. 1 shows a schematic diagram of a high-voltage network 1 of a motor vehicle in the operating state. The high-voltage network is supplied via a high-voltage battery 2, which can be separated via connectors 3 form the high voltage network 1. Further an electric machine 4 is provided which can contribute to driving the motor vehicle or can derive electric energy form the movement of the motor vehicle. The electric machine 4 is operated with a DC voltage so that conversion is required. This is accomplished in the power electronics component 5 to which also the electric machine 4 and also the high-voltage battery 2 are connected. In the present case the power electronics component 5 has an inverter 7 arranged in a housing 6, a converter 8, an intermediate circuit capacitor 9 and a passive discharge resistor 10. The discharge resistor is connected in parallel with the intermediate circuit capacitor 9. When an active discharge of the intermediate circuit capacitor 9 fails, the discharge can also be accomplished passively via the discharge resistor 10.

In the high-voltage network 1, further high-voltage loads can be operated, in the present case a charger 11 with associated charging socket 12, a compressor 13 for an air-conditioning system of the motor vehicle and a high-voltage heating device 14. In order to supply the components with electric energy, the power electronics component 5 has a touch-guarded plug-in terminal 15, into which an also touch-guarded connector 16 can be inserted, which belongs to a cable 17, which supplies the high-voltage loads 11, 13 and 14. In the present case the compressor 13 and the heating device 14 are coupled via the charging device 11, however other infrastructures are also conceivable.

In order to enable a fast separation of the high-voltage loads form the high voltage supply a fuse 18 is arranged between the parallel connection of intermediate circuit capacitor 9 and discharging resistor 10 and the plug-in terminal 15. All components have a connection to a reference potential (ground) 19.

When work on the motor vehicle 1, in particular concretely on the high-voltage network 1, is performed it has to be ensured that no person comes into contact with high voltage. The high-voltage network 1 also has to be completely switched off and discharged ("disconnected"). Hereby it has to be in particular ensured that no residual high voltages are present in the power electronics component 5, which may conceivably be accomplished by opening a lid of the housing 6 and measuring voltages at different sites inside the power electronics component 5. This however is avoided with the method according to the invention, which is explained in more detail below.

For the general disconnection of the high-voltage network 1, several steps have to be performed initially to effect a shutdown. First it has to be ensured of course that no external voltage sources, for example charging cables, are connected to the motor vehicle. Then the high-voltage system has to be deactivated, which concretely means that the ignition (clamp 15) has to be turned off thereby resulting in opening of the contactors 3 of the high-voltage battery 2 (turn off of the clamp 3 of both contactors). Then in this exemplary embodiment the 12V service disconnect, which can for example be arranged in the motor compartment, has to be actuated, in particular pulled out. This interrupts the high-voltage pilot line (high volt interlock) and additionally or redundantly interrupts the current supply (clamp 30c) to the contactors 3. In order to avoid a reactivation, the service disconnect can be secured with a padlock. Also the electric energy supply to a low-voltage network, whose voltage is lower than that of the high-voltage network 1, can be interrupted.

Now it has to be ensured that no voltages remain in the power electronics component 5, in particular also in the intermediate circuit capacitor 9, i.e., the power electronics component is switched voltage-free. For this the method according to the invention provides to first separate the high-voltage loads, i.e., the charging device 11, the compressor 13 and the testing device 14 from the power electronics component 5. This can be accomplished in two different ways, which can both be used. On one hand the connector 16 of the cable 17 on the power electronics component 5 can be pulled, on the other hand however also the connector 20 of the cable 17 on the target connection 42 of the charging device 11.

Figure 2:
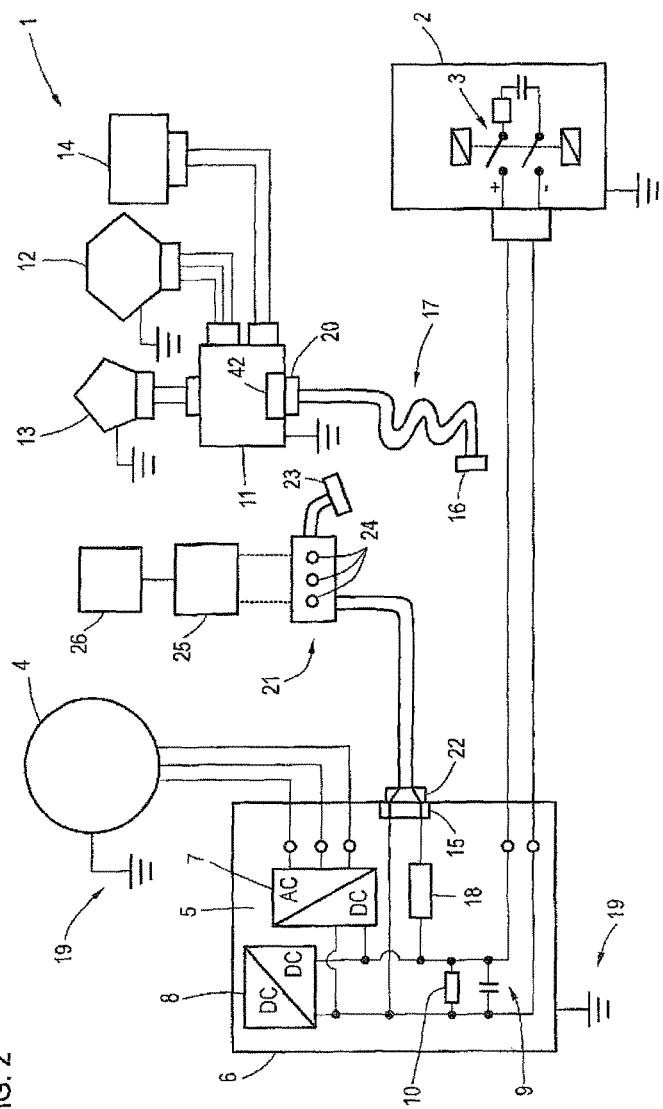
FIG. 2 a state of the high voltage network according to FIG. 1 in a first variant of the method according to the invention, FIG. 3 a state of the high-voltage network according to FIG. 1 in a second variant of the method according to the invention, FIG. 4 a schematic diagram for measuring a voltage course, FIG. 5 a schematic diagram for measuring a resistance, FIG. 7 a possible resistance course with a second setpoint range, and FIG. 8 the state of the high voltage network according to FIG. 1 at a later time point in the first variant of the method according to the invention.
Figure 3:
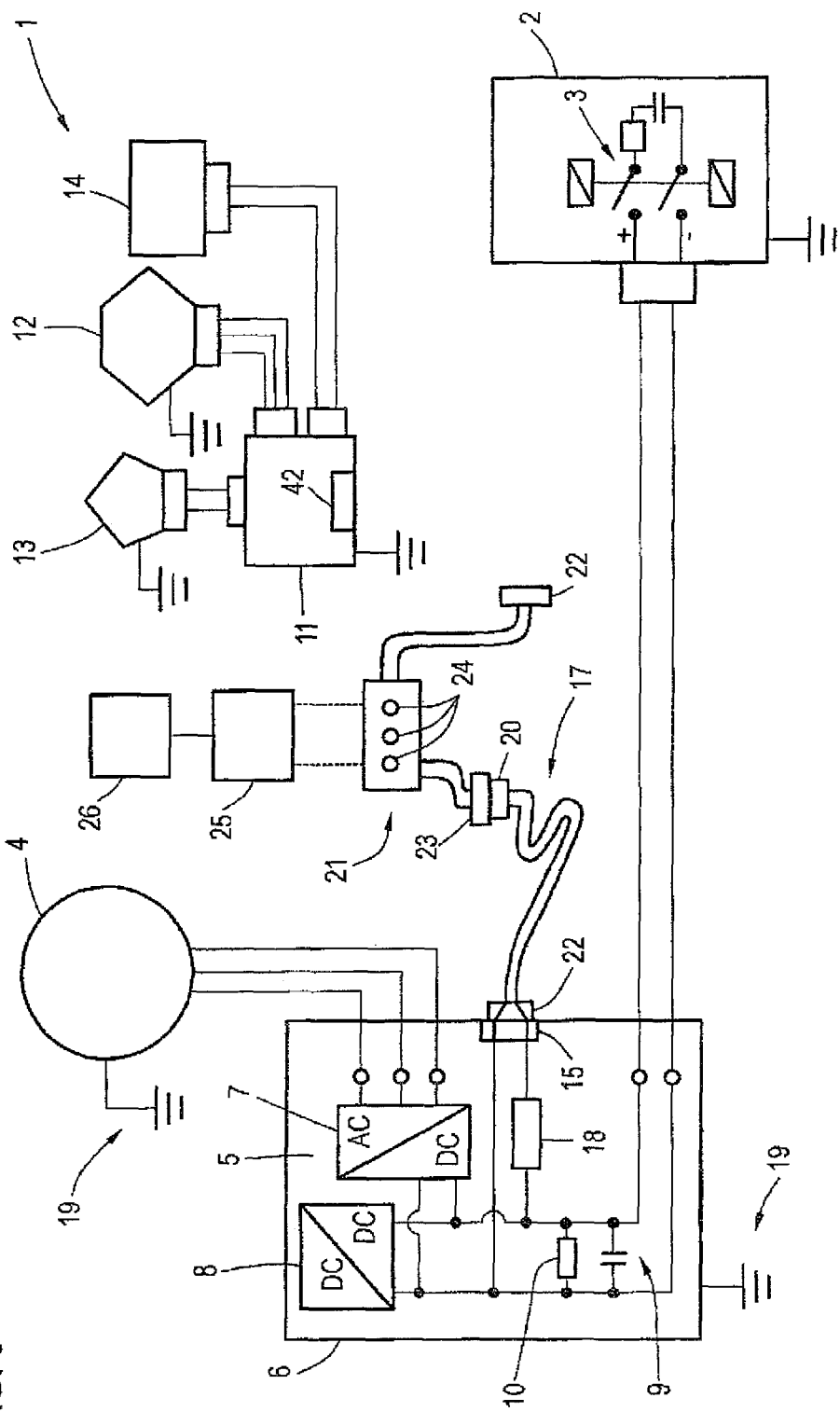

These two variants of the method according to the invention are respectively shown in FIGS. 2 and 3. The following discussion is based on both Figures together since the only difference is whether the cable 17 is interposed or not. First a measuring adapter 21 is connected to the power electronics component 5. In the case of FIG. 2 this is accomplished by directly connecting the measuring adapter 21 to the plug-in terminal 15 via a connector 22, which corresponds to the standard of the connector 16. In the case of FIG. 3 the connector 20 of the cable 17 is inserted into a plug-in terminal 23 of the measuring adapter 21. The measuring adapter 21 has measuring connections 24, which are ideally suited for connection of a measuring device 25, downstream to which in the present case an analysis device 26 is arranged. Via the measuring device 25 different measurements can be performed, predominantly via the high-voltage contacts of the plug-in terminal 15, preferably without requiring opening of the power electronics component 5.

A first optional measuring sequence involves a first pre-measurement regarding the absence of voltage in the power electronics component 5. In this first measuring sequence the measuring device 25 is first tested by measuring a reference voltage, here by measuring the voltage of a low-voltage battery of the low-voltage network of the motor vehicle, which means the reference voltage is 12V. When in this way the correct functioning of the measuring device 25 is verified, the voltage present via the high-voltage contacts of the plug-in terminal 15 is measured. When the fuse 18 is not defective and all other components in the measuring pathway function properly, this measuring result would indicate whether a high voltage still remains in the power electronics component 5. However, when a cable is interrupted or the fuse 18 is defective this measurement would not be reliable, i.e., the absence of voltage is not conclusive.

Therefore a second measuring cycle follows in which in a first exemplary embodiment of the present invention a voltage course is measured after applying a supply voltage to the high-voltage contacts of the plug-in terminal 15, in the more preferred second exemplary embodiment, however, a resistance is measured after applying a supply voltage, which is explained with reference to FIGS. 4-7.

First it is noted, however, that already prior to the start of the first measuring cycle usually a certain waiting period is observed in order to ensure the active or passive discharge of the power electronics component 5. In case of an active discharge, for example after 150 seconds, a residual voltage of less than 0.5 V can normally be reached, in the case of a passive discharge in the case of an error this takes for example 360 s, wherein these values of course depend on the concrete configuration. When the active discharge fails and it is determined in the first measuring cycle after the corresponding waiting period that the voltage still decreases, it can be waited to see whether the passive discharge was successful.

Figure 4:
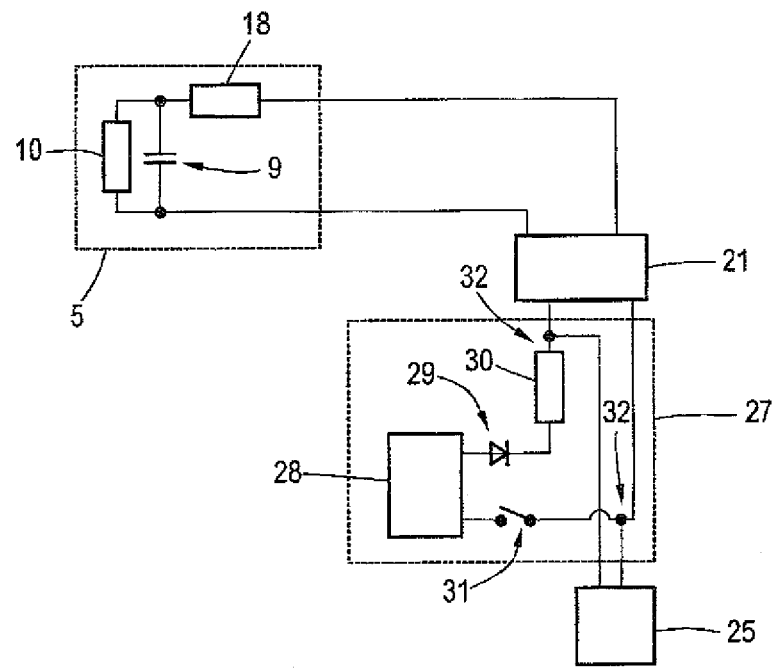

FIG. 4 shows a simplified representation of the circuit in the case of measuring a voltage course. Only the essential components of the power electronics component 5 are shown, i.e., the intermediate circuit capacitor 9, the discharge resistor 10 and the fuse 18. Onto the measuring adapter 21 an additional adapter 27 is attached, which contains a power supply 28, which provides the supply voltage, here 24V. For protecting the power supply 28, the additional adapter 27 also contains a protective diode 29 with a breakdown voltage of 1000V. Further provided is a charging resistor 30. Via the switch 31 the supply voltage can be connected in a targeted manner. The voltage course is measured by the measuring device 25 at the pick-off sites 32.

Figure 5:
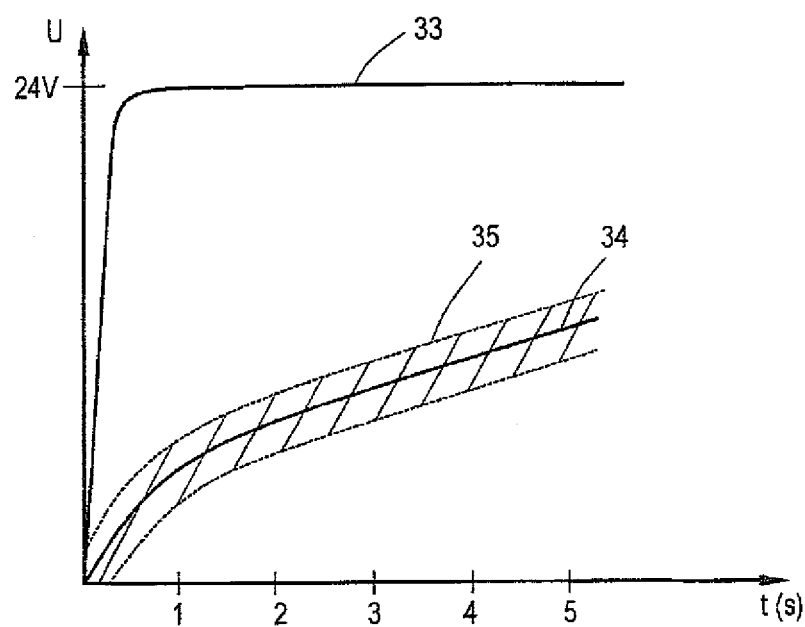

When the fuse 18 is defective, a very fast, in particular abrupt, increase of the measured voltage to the supply voltage is expected as measuring result, as soon as the supply voltage is applied, i.e., the switch 31 is closed. This is shown in FIG. 5 by way of a curve 33, which shows the measured voltage plotted against the time. A similar behavior is expected when for example a cable is interrupted. However, when the overall system, in particular also the fuse 18, functions properly, the capacitor 9 is slowly charged, resulting for example in a course as shown in curve 34. Based on this course the absence of voltage in the power electronics component 45 can be safely concluded. Since fluctuations can occur during the measurements, the limits of this range, which indicates the correct absence of voltage, have been determined by calibrating measurements, simulations and/or calculations so that a first setpoint range 35 results within which the measured voltage course should be located. In the present exemplary embodiment the analysis device 26 tests this automatically and correspondingly indicates whether the absence of voltage is conclusive or whether the absence of voltage not given or another error is present. Of course the voltage course can also be analyzed in more detailed if desired, for example with regard to what error may be present. For example a voltage course as in curve 33 indicates that the fuse 18 is defective or a cable or line is broken. In the case of a short circuit, the voltage of 0V would be determined. However, it is also possible to largely simplify the measurement for example by using a delay element, which only tests whether after a certain time period, for example 0.5 s, the voltage is still lower than a defined threshold value, for example 20V.

Figure 6:
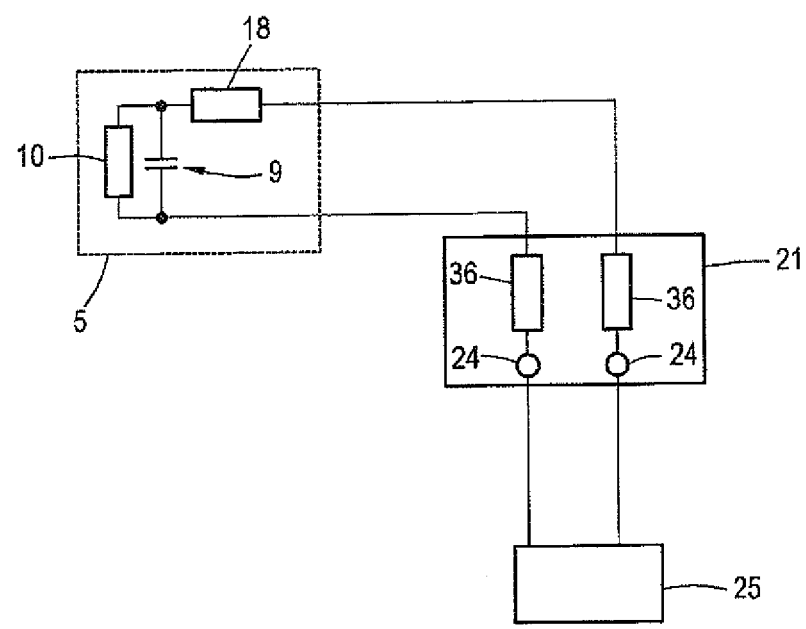
Figure 7:
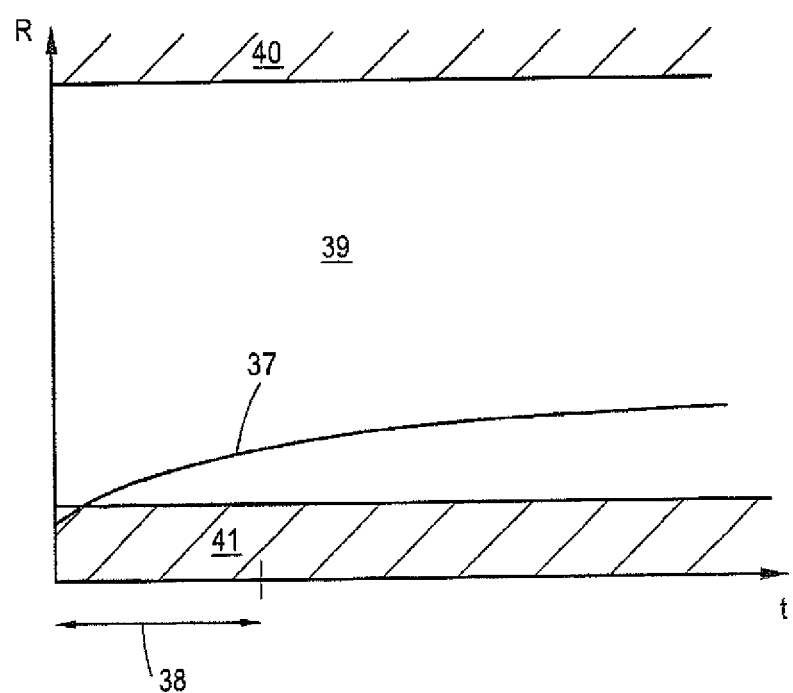

A simpler embodiment, which is preferred according to the invention, results when a resistance is measured which is explained in more detail by FIGS. 6 and 7.

FIG. 6 also only shows the components of the power electronics component 5 that are essential for the measurement, i.e., the discharge resistor 10, the intermediate circuit capacitor 9 and the fuse 18. At least in this case touch protective resistors 36, presently with a value of 100 kΩ, are provided upstream of the measuring connections 24 in the measuring adapter 21. These not only increase the safety of the measuring adapter 21 in the case of multiple errors, but also offer a type of base value for the measurement of the resistance by the measuring device 25, which in this case directly provides the supply voltage of for example 4V as the measuring voltage. Thus no additional adapter 27 is required.

FIG. 7 illustrates the principle of the resistance measurement by way of showing the measured resistance plotted against the time after applying the supply voltage, i.e., the beginning of the resistance measurement. As can be seen the resistance increases according to curve 37, which represents a system in the absence of errors, while the intermediate circuit capacitor 9 is charged. Thus for the resistance measurement a defined waiting period 38 is observed, which can also be determined by calibration, simulation and/or calculation and which is for example between seven and twenty one seconds, after which it is then tested whether the measured resistance value is within a second setpoint range 39 which in FIG. 7 is shown in a solid line. This setpoint range can again be easily obtained by calibration measurements, simulations and/or calculations. Remarkable is in this case the significance of resistances in other ranges. When a very high resistance, for example in the range of 40 is measured, this indicates an interrupted cable or line or a defective fuse 18. The range 41 for example covers short circuits, in particular in the measuring device 25 or the measuring adapter 21 or in the interior of the power electronics component 5. Also in this case the analysis device 26 can provide an interpretation beyond a binary decision.

While the measuring device 25 is configured for resistance measurements it is also advantageous in the second measuring cycle to measure a resistance between the reverence potential 19 and the shielding contact of the measuring adapter 21, for preparing further measurements in the third measuring cycle that will be explained below. Only when both are on the same potential can subsequent measurements be analyzed in a meaningful manner. However, this is again optional.

It is noted that the setpoint ranges 35, 39, as far as meaningfully possible, can be determined for multiple vehicles with different specifications regarding the high-voltage system 1, in particular for an entire fleet of a manufacturer.

Figure 8:
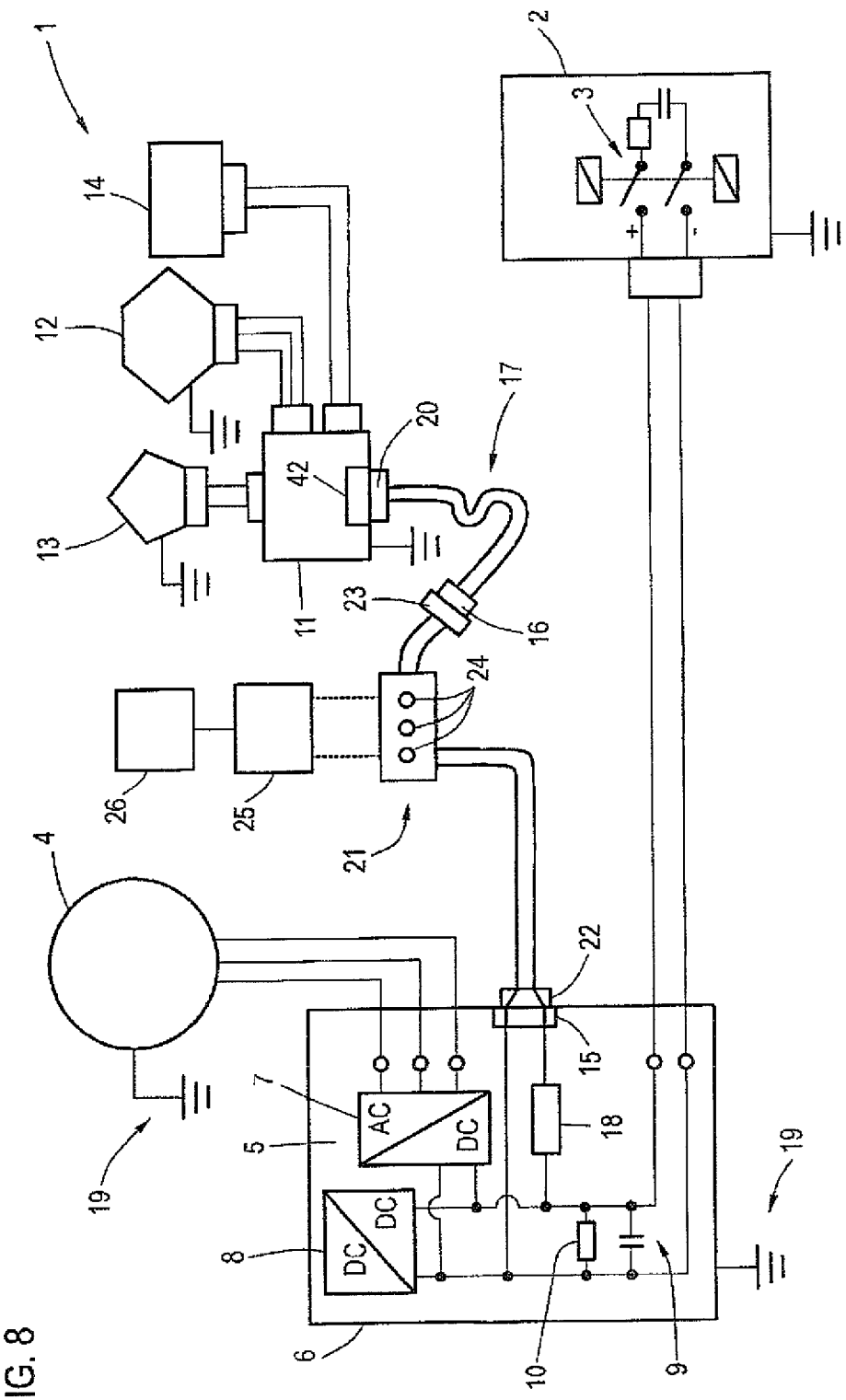

After the main measurements in the second measuring cycle, a third measuring section can be performed for which the high-voltage loads are reconnected to the power electronics component 5, however, this time via the measuring adapter 21. This is exemplarily shown in FIG. 8 for the first variant (FIG. 2), according to which the connector 16 of the cable 17 is then inserted into the plug-in terminal 23 of the measuring adapter 21. In the second variant (FIG. 3) the connector 22 of the measuring adapter 21 would be connected to the charger 11, target connection 42.

Then the absence of voltage can first be determined by again measuring the voltage via the high-voltage contacts of the plug-in terminal 15, in this case for the entire high-voltage network 1. Since also a measuring connection 24 for a shielding contact is provided, possible voltages between the reference potential 19 and the high-voltage contacts of the plug-in terminal can also be determined in order to cover further conceivable errors.

As mentioned above, the third measuring section is optional since the essential feature is to detect whether the power electronics component 5 is switched voltage-free, because in the present exemplary embodiment the plug-in terminals of the high-voltage loads are usually configured touch protected.

It is noted that also for the third measuring cycle, the measuring device 25 can of course again be tested via the reference voltage of the low-voltage battery.

What is claimed is:

1. A method for testing an absence of voltage on a power electronics component connected with a high-voltage battery and an electric machine in a high-voltage network of a motor vehicle, wherein the power electronics component has an intermediate circuit capacitor, a passive discharge resistor, a plug-in terminal and a fuse arranged upstream of the plug-in terminal, and is connected to at least one high-voltage load via a cable having first and second connectors respectively inserted in the plug-in terminal and in a target terminal, said method comprising
after separation of the first or second connector from the plug-in terminal or the target terminal, applying a supply voltage via high-voltage contacts of the plug-in terminal;
measuring with a measuring device a voltage course and/or, after a defined charging time period of the intermediate capacitor, a resistance; and
determining the absence of voltage when the voltage course is within a first setpoint range or the resistance is within a second setpoint range.

2. The method of claim 1, further comprising prior to the measuring of the voltage course and/or the resistance, measuring a voltage via the high-voltage contacts of the plug-in terminal.

3. The method of claim 1, further comprising after the measuring of the voltage course and/or the resistance when the absence of voltage has been determined, measuring a voltage via the high-voltage contacts of the plug-in terminal with at least one high-voltage load being reconnected.

4. The method of claim 3, further comprising measuring a voltage between a respective one of the high-voltage contact of the plug-in terminal and a shielding contact to a reference potential.

5. The method of claim 4, wherein the reference potential is ground.

6. The method of claim 2, further comprising prior to the measuring of the voltage course, testing a functionality of the measuring device by measuring a reference voltage.

7. The method of claim 6, wherein the reference voltage is a voltage of a low-voltage battery of the low-voltage network.

8. The method of claim 1, further comprising after the separation of the first or second connector from the plug-in terminal or the target terminal, connecting a measuring adapter to the plug-in terminal or the cable inserted in the plug-in terminal, wherein the measuring device and the supply voltage are connected to high-voltage measuring connections of the measuring adapter.

9. The method of claim 8, wherein the measuring adapter has a touch protective resistor for each of the high-voltage measuring connections, said touch protective resistor being taken into account for determining the first and/or second setpoint range.

10. The method of claim 8, wherein the touch protective resistor is taken into account for the resistance.

11. The method of claim 1, wherein the analysis of the voltage course and/or the resistance is performed by an analysis device arranged downstream of the measuring device.

12. The method of claim 11, wherein the measuring device and/or the analysis device (26) are a part of a repair-shop tester.

13. The method of claim 1, wherein the first and/or second setpoint range is determined from results of a calibration measurement and/or from a simulation and/or from theoretical calculations.

14. The method of claim 1, wherein the first and/or second setpoint is selected to be valid for at least two motor vehicles with different specifications.

15. The method of preceding claim 1, wherein the supply voltage is lower than 30 Volt.

16. The method of claim 1, wherein for measuring the voltage course a power supply is used for supplying the supply voltage.

17. The method of claim 16, wherein a protective diode is used for protection of the power supply.

* * * * *